(12) United States Patent
Tanizaki et al.

(10) Patent No.: US 6,791,876 B2
(45) Date of Patent: Sep. 14, 2004

(54) THIN-FILM MAGNETIC MEMORY DEVICE SUPPRESSING PARASITIC CAPACITANCE APPLIED TO DATA LINE OR THE LIKE

(75) Inventors: Hiroaki Tanizaki, Hyogo (JP); Takaharu Tsuji, Hyogo (JP); Hideto Hidaka, Hyogo (JP)

(73) Assignees: Renesas Technology Corp., Tokyo (JP); Mitsubishi Electric Engineering and Company Limited, Tokyo (JP)

( * ) Notice: Subject to any disclaimer, the term of this patent is extended or adjusted under 35 U.S.C. 154(b) by 0 days.

(21) Appl. No.: 10/397,352

(22) Filed: Mar. 27, 2003

(65) Prior Publication Data

US 2004/0071014 A1 Apr. 15, 2004

(30) Foreign Application Priority Data

Oct. 9, 2002 (JP) ........................................ 2002-296483

(51) Int. Cl.[7] .............................................. G11C 11/00
(52) U.S. Cl. ......................... 365/171; 365/158; 365/173
(58) Field of Search ................................ 365/171, 158, 365/173

(56) References Cited

U.S. PATENT DOCUMENTS 6,205,073 B1    3/2001  Naji
6,611,454 B2 *  8/2003  Hidaka ........................ 365/171
6,614,681 B2 *  9/2003  Hidaka ........................ 365/171
6,646,911 B2 * 11/2003  Hidaka ........................ 365/173

FOREIGN PATENT DOCUMENTS

JP          2001-243760 A      9/2001

OTHER PUBLICATIONS

Scheuerlein et al., "A 10ns Read and Write Non–Volatile Memory Array Using a Magnetic Tunnel Junction and FET Switch in Each Cell." ISSCC Digest of Technical Papers, TA7.2, Feb. 2000, pp. 128–129.

Naji et al., "A 256kb 3.0V 1T1MTJ Nonvolatile Magnetoresistive RAM." ISSCC Digest of Technical Papers, TA7.6, Feb. 2001, pp. 122–123.

* cited by examiner

Primary Examiner—Son Mai
(74) Attorney, Agent, or Firm—Burns, Doane, Swecker & Mathis, L.L.P.

(57) ABSTRACT

A plurality of bit lines are divided into a plurality of groups each including Y (Y: integer of at least two) bit lines. Y data read data lines passing a data read current therethrough in data reading are provided along with Y connection control parts electrically coupling Y bit lines and the Y read data lines with each other every group. Therefore, the connection control parts electrically connected with the Y read data lines are uniformly divided so that parasitic capacitance applied to the read data lines following electrical connection with the connection control parts can be suppressed. Therefore, the time for charging the read data lines to a prescribed voltage level can be reduced for executing high-speed data reading.

12 Claims, 9 Drawing Sheets

THIN-FILM MAGNETIC MEMORY DEVICE SUPPRESSING PARASITIC CAPACITANCE APPLIED TO DATA LINE OR THE LIKE

BACKGROUND OF THE INVENTION

1. Field of the Invention

The present invention relates to a thin-film magnetic memory device, and more specifically, it relates to a random-access thin-film magnetic memory device comprising memory cells each having a magnetic tunnel junction (MTJ).

2. Description of the Background Art

A MRAM (magnetic random access memory) device has recently been watched with interest as an advanced nonvolatile semiconductor memory device. The MRAM device is a nonvolatile memory device storing data in a plurality of thin-film magnetic materials formed on a semiconductor integrated circuit in a nonvolatile manner, with each thin-film magnetic body accessible at random. In particular, it has recently been announced that the performance of the MRAM device remarkably progresses when employing thin-film magnetic bodies utilizing magnetic tunnel junctions (MTJ) as memory cells. Technical literature such as "A 10ns Read and Write Non-Volatile Memory Array using a Magnetic Tunnel Junction and FET Switch in each Cell", ISSCC Digest of Technical Papers, TA7.2, February 2000 discloses such an MRAM device comprising memory cells having magnetic tunnel junctions.

A memory cell (hereinafter referred to also as "MTJ memory cell") having a magnetic tunnel junction, formable with an MTJ element and an access element such as a transistor, for example, is advantageous also for high integration. The MTJ element has a magnetic layer magnetizable in a direction responsive to an applied magnetic field, and the MTJ memory cell stores data through such a characteristic that the electric resistance (junction resistance) in the MTJ element varies with the direction of magnetization of the magnetic layer.

In order to read the data stored in the MTJ memory cell, electric resistance difference responsive to the level of the stored data must be detected. More specifically, the data is read on the basis of a current, varying with the electric resistance (i.e., the stored data), passing through the MTJ memory cell. In general, the MTJ element has electric resistance of several 10 k$\Omega$, with electric resistance difference of about 20 to 30% resulting from difference between the levels of stored data. In consideration of the reliability of the MTJ element, a voltage of about 0.5 V is properly applied in data reading and hence the aforementioned pass current remains on the order of microamperes ($\mu$A: $10^{-6}$ A).

On the other hand, a large capacity memory array generally includes a plurality of bit lines provided in correspondence to rows or columns and a data line, provided in common in correspondence to the plurality of bit lines, connected to a circuit detecting stored data. In this structure, the data line and a selected bit line are charged to a prescribed voltage level for supplying a pass current to a memory cell in data reading, while the data line is electrically coupled not only to the selected bit line but also to the remaining non-selected bit lines through transistors or the like. Thus, unignorable parasitic capacitance of the transistors or the like is applied to the data line.

This parasitic capacitance applied to the data line inhibits the charge of the data line etc. to the prescribed level, leading to hindrance to high-speed data reading.

In the aforementioned structure, further, a circuit is generally provided every bit line for supplying a data write current responsive to write data to the selected bit line in data writing, while a signal line or the like is arranged in common in correspondence to this circuit for transmitting the write data.

Also in this structure, the signal line or the like arranged in common is electrically coupled not only to a selected circuit but also to non-selected circuits. Consequently, unignorable parasitic capacitance of the non-selected circuits is applied to the signal line or the like. The parasitic capacitance applied to the signal line or the like results in propagation delay of the write data in data writing, to hinder high-speed data writing.

SUMMARY OF THE INVENTION

The present invention has been proposed in order to solve the aforementioned problems, and an object thereof is to provide a structure of a thin-film magnetic memory device capable of executing high-speed data reading and high-speed data writing by suppressing parasitic capacitance applied to a data line and a signal line or the like. transmitting write data or the like.

The thin-film magnetic memory device according to the present invention includes a plurality of memory cells arranged in rows and columns, a plurality of first bit lines, X write data lines transmitting write data and a plurality of first write control circuits. The plurality of memory cells magnetically store data. The plurality of first bit lines are provided corresponding to the memory cell columns respectively. The plurality of first bit lines are divided into a plurality of groups. Each of the plurality of groups includes X (X: integer of at least two) first bit lines. The plurality of first write control circuits are provided corresponding to the plurality of first bit lines respectively for supplying a data write current in accordance with the write data. The X write data lines are electrically coupled with corresponding X first write control circuits respectively in each of groups, respectively.

In this thin-film magnetic memory device, the plurality of first bit lines are divided into a plurality of groups each including X first bit lines. The X write data lines are provided for transmitting the write data. Each of the X write data lines is electrically coupled with X first write control circuits belonging to each group. According to the present invention, the write control circuits electrically connected with the X write data lines are uniformly divided as hereinabove described, so that parasitic capacitance applied to the write data lines following electrical connection with the write control circuits can be suppressed. Thus, the propagation time for the write data transmitted through the write data lines can be reduced for executing high-speed data writing.

Alternatively, the thin-film magnetic memory device according to the present invention includes a plurality of memory cells arranged in rows and columns, a plurality of first bit lines, Y read data lines, Y read circuits, a plurality of column selection lines and Y connection control parts. The plurality of memory cells magnetically store data. The plurality of first bit lines are provided corresponding to the memory cell columns respectively. The plurality of first bit lines are divided into a plurality of first groups in data reading. Each of the plurality of first groups includes Y (Y: integer of at least two) first bit lines. At least one of the Y read data lines is supplied with a current in a state electrically connected with a selected memory cell among the plurality of memory cells selected as a subject for data read coupled to a first voltage in data reading. The Y read circuits are provided corresponding to the Y read data lines so that each read circuit electrically couples the corresponding read data line and a second voltage with each other in data reading. The Y read circuits generate read data on the basis of currents passing through the corresponding read data lines. The plurality of column selection lines are provided corresponding to the plurality of first groups respectively. A plurality of connection control parts are provided corresponding to the plurality of first groups respectively so that each connection control part electrically couples the corresponding Y first bit lines and the Y read data lines, respectively, in the corresponding first group among the plurality of first groups in response to activation of the corresponding column selection line.

In this thin-film magnetic memory device, the plurality of first bit lines are divided into the plurality of first groups each including Y first bit lines. The Y read data lines are provided so that a data read current passes therethrough in data reading. The Y connection control parts are provided for electrically coupling the Y first bit lines and the Y read data lines with each other every first group. According to the present invention, therefore, the connection control parts electrically connected with the Y read data lines are uniformly divided so that parasitic capacitance applied to the read data lines following electrical connection with the connection control parts can be suppressed. Thus, a time for charging the read data lines to a prescribed voltage level can be reduced for executing high-speed data reading.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
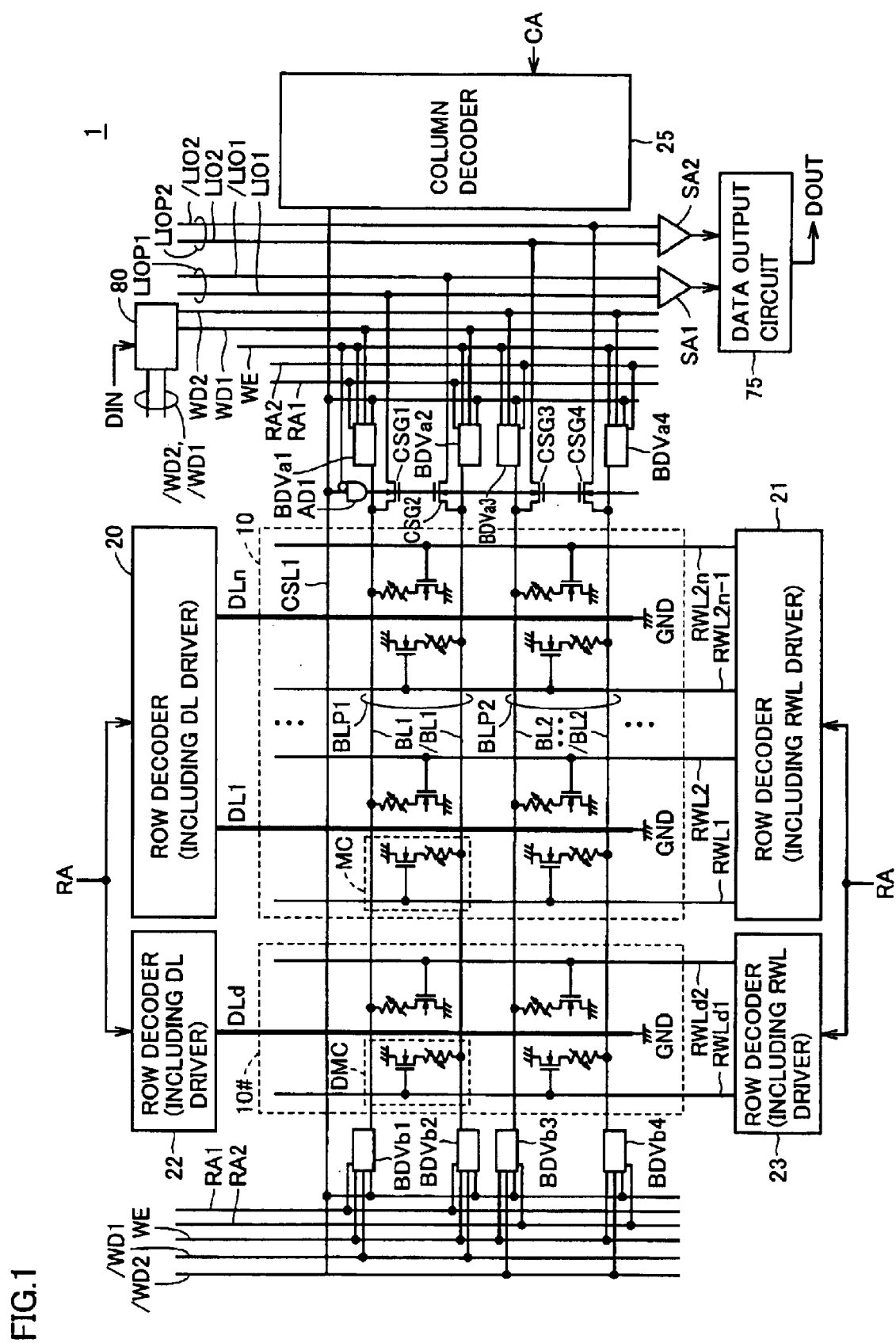
FIG. 1 is a circuit diagram showing the array structure of an MRAM device according to a first embodiment of the present invention.

Embodiments of the present invention are now described in detail with reference to the drawings. Referring to the drawings, identical or corresponding parts are denoted by the same reference numerals, and redundant description is not repeated.

First Embodiment

Referring to FIG. 1, an MRAM device 1 according to a first embodiment of the present invention comprises a memory array 10 formed by a plurality of MTJ memory cells MC arranged in rows and columns, a dummy memory array 10# formed by a plurality of dummy memory cells DMC, row decoders 20 and 21 executing row selection in the memory array 10 on the basis of a row address RA, row decoders 22 and 23 executing row selection in the dummy memory array 10# on the basis of the row address RA and a column decoder 25 executing column selection in the memory array 10 and the dummy memory array 10# on the basis of a column address CA.

The structure and a data storage principle of each MTJ memory cell MC are now described with reference to FIG. 2.

Figure 2:
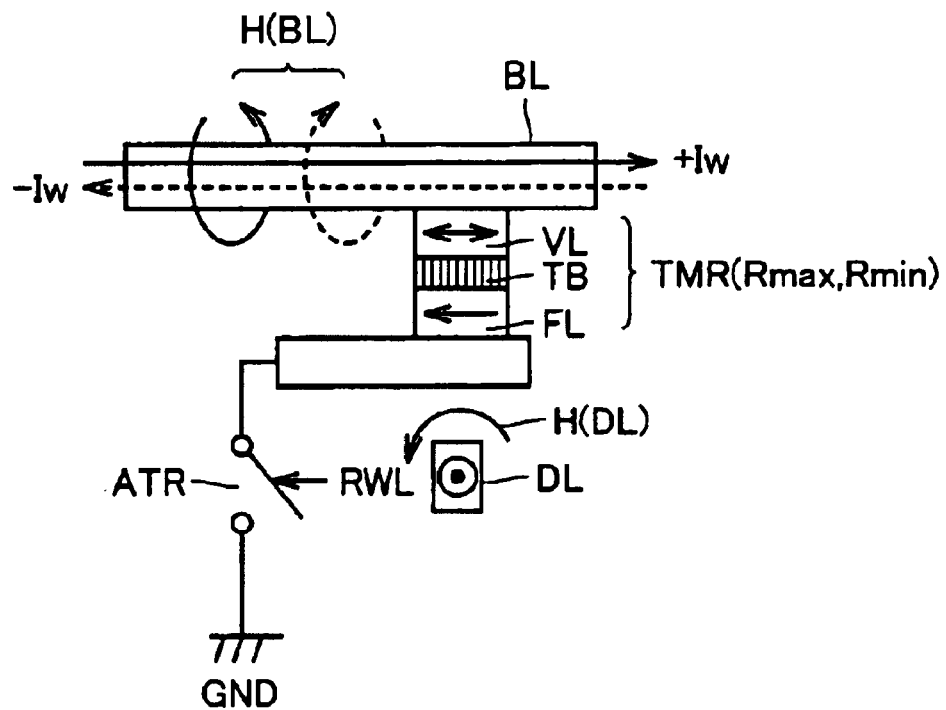
FIG. 2 is a conceptual diagram illustrating the structure and a data storage principle of an MTJ memory cell.

Referring to FIG. 2, a tunnel magnetic resistance element TMR includes a ferromagnetic layer (hereinafter also referred to simply as "fixed magnetization layer") FL having a fixed constant direction of magnetization and another ferromagnetic layer (hereinafter also referred to simply as "free magnetization layer) VL magnetizable in a direction responsive to an externally applied magnetic field. A tunnel barrier (tunnel film) TB formed by an insulator film is provided between the fixed magnetization layer FL and the free magnetization layer VL. The free magnetization layer VL is magnetized in the same or opposite direction as or to the fixed magnetization layer FL in response to the level of write data. The fixed magnetic layer FL, the tunnel barrier TB and the free magnetization layer VL form a magnetic tunnel junction.

The electric resistance of the tunnel magnetic resistance element TMR varies with the relation between the directions of magnetization of the fixed and free magnetization layers FL and VL. More specifically, the electric resistance of the tunnel magnetic resistance element TMR reaches the minimum value Rmin when the directions of magnetization of the fixed and free magnetization layers FL and VL are identical (parallel) to each other, and reaches the maximum value Rmax when the directions of magnetization thereof are opposite (antiparallel) to each other.

In data writing, a word line RWL is activated and an access transistor ATR is turned off. In this state, a data write current for magnetizing the free magnetization layer VL is fed in a direction responsive to the level of the write data in each of a bit line BL and a digit line DL.

Figure 3:
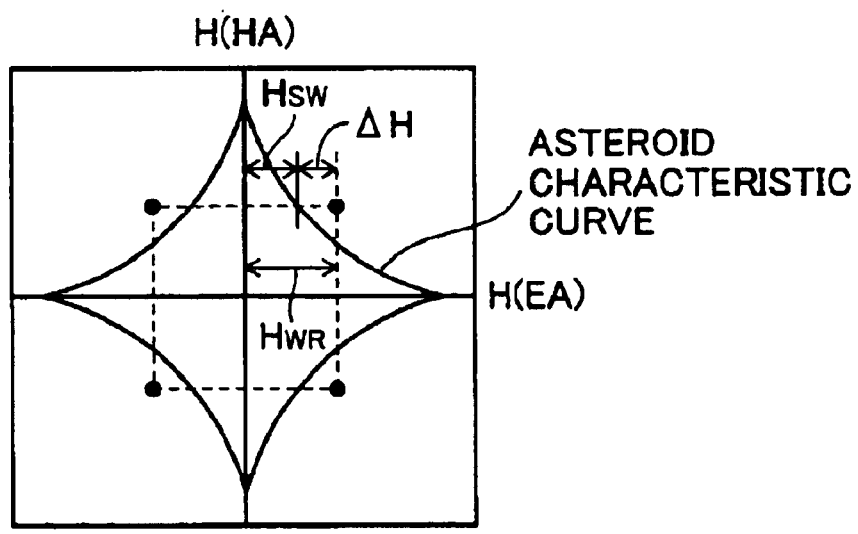
FIG. 3 is a conceptual diagram showing the relation between supply of a data write current to the MTJ memory cell and directions of magnetization of a tunnel magnetic resistance element.

FIG. 3 shows the relation between supply of the data write current to the MTJ memory cell MC and the directions of magnetization of the tunnel magnetic resistance element TMR.

Referring to FIG. 3, the horizontal axis shows a magnetic field H(EA) applied in the direction of an easy axis (EA) of magnetization in the free magnetization layer VL provided in the tunnel magnetic resistance element TMR. The horizontal axis shows a magnetic field H(HA) acting in the direction of a hard axis (HA) of magnetization in the free magnetization layer VL. The magnetic fields H(EA) and H(HA) correspond to two magnetic fields formed by the currents flowing through the bit line BL and the digit line DL respectively.

In the MTJ memory cell MC, the fixed direction of magnetization of the fixed magnetization layer FL is along the easy axis of magnetization of the free magnetization layer VL, which in turn is magnetized in a parallel or antiparallel (opposite) manner to the fixed magnetization layer FL along the easy axis of magnetization in response to the level of stored data. The MTJ memory cell MC can store 1-bit data in correspondence to the two directions of magnetization of the free magnetization layer VL.

The direction of magnetization of the free magnetization layer VL can be newly written only when the sum of the applied magnetic fields H(EA) and H(HA) reaches any region outside the asteroid characteristic curves shown in FIG. 3. In other words, the direction of magnetization of the free magnetization layer VL remains unchanged if the applied data write magnetic field has intensity corresponding to the region inside the asteroid characteristic curves.

As shown by the asteroid characteristic curves, the magnetization threshold necessary for changing the direction of magnetization along the easy axis of magnetization can be reduced by applying the magnetic field H(HA) along the hard axis of magnetization to the free magnetization layer VL. As shown in FIG. 3, operating points in data writing are so designed that the data stored in the MTJ memory cell MC, i.e., the direction of magnetization of the tunnel magnetic resistance element TMR is rewritable when prescribed data write currents are fed to both of the digit line DL and the bit line BL.

With the operating points illustrated in FIG. 3, the data write magnetic field H(EA) along the easy axis of magnetization is so designed that the intensity thereof reaches a level $H_{WR}$ in the MTJ memory cell MC in which the data is written. In other words, the value of the data write current fed to the bit line BL or the digit line DL is so designed as to obtain the data write magnetic field $H_{WR}$. In general, the data write magnetic field $H_{WR}$ is expressed as the sum of a switching magnetic field $H_{SW}$ necessary for switching the direction of magnetization and a margin $\Delta H$ as follows:

$$H_{WR}=H_{SW}+\Delta H$$

The direction of magnetization once written in the tunnel magnetic resistance element TMR, i.e., the data stored in the MTJ memory cell MC is held in a nonvolatile manner until new data writing is executed. While the electric resistance of each memory cell MC is expressed in the sum of the ON-state resistance values of the tunnel magnetic resistance element TMR and the access transistor ATR and other parasitic resistance in a strict sense, resistance components other than that of the tunnel magnetic resistance element TMR remain constant regardless of the stored data and hence it is assumed that Rmax and Rmin also represent two types of electric resistance values of normal memory cells responsive to stored data respectively and AR represents the difference therebetween as follows:

$$\Delta R=Rmax-Rmin$$

Each of the dummy memory cells DMC arranged on the dummy memory array 10# shown in FIG. 1 is fixedly set to an intermediate electric resistance value of the previously written electric resistance values Rmax and Rmin.

Referring again to FIG. 1, a complementary pair of bit lines BLP are arranged in correspondence to each pair of adjacent memory cell columns in the memory array 10, for example. Read word lines RWL1 to RWL2n are arranged in correspondence to the memory cell rows respectively. Further, digit lines DL1 to DLn are provided in correspondence to the adjacent pairs of memory cell rows, to be shared by the adjacent pairs of memory cell rows respectively.

More specifically, FIG. 1 shows a pair of bit lines BLP1 formed by complementary bit lines BL1 and /BL1 and another pair of bit lines BLP2 formed by complementary bit lines BL2 and /BL2, for example. Further, odd read word lines RWL1, RWL3, . . . , RWL2n–1 are arranged in correspondence to memory cell rows formed by the memory cells MC corresponding to the complementary bit lines /BL1, BL2 . . . respectively. On the other hand, it is assumed that even read word lines RWL2, RWL4, . . . , RWL2n are arranged in correspondence to memory cell rows formed by the memory cells MC corresponding to the bit lines BL1, BL2, respectively. The digit line DL1 is shared by the adjacent pair of memory cell rows corresponding to the read word lines RWL1 and RWL2. In other words, the adjacent pairs of memory cell rows share the digit lines DL, so that the number of the digit lines DL can be reduced. Thus, a wiring pitch for digit line drivers described later can be sufficiently ensured for improving the yield.

The dummy memory array 10# includes a plurality of dummy memory cells DMC arranged one by one to share the memory cell columns of the memory array 10. The dummy memory array 10# further includes a read word line RWLd2 provided in correspondence to dummy memory cell columns formed by the dummy memory cells DMC corresponding to the bit lines BL1, BL2, . . . and a read word line RWLd1 provided in correspondence to dummy memory rows formed by the dummy memory cells DMC corresponding to the complementary bit lines /BL1, /BL2, . . . . The dummy memory array 10# further includes a digit line DLd provided in common to the dummy memory cells DMC corresponding to the read word lines RWLd1 and RWLd2 respectively.

According to this structure, the dummy memory cells DMC are arranged to share the memory cell columns, thereby sharing the bit lines BL with the normal memory cells MC and allowing an efficient layout of the dummy memory cells DMC.

The read word lines RWL1 to RWL2n, RWLd1 and RWLd2, the digit lines DL1 to DLn and DLd and the pairs of bit lines BLP1, BLP2, . . . are hereinafter also generically referred to as read word lines RWL, digit lines DL and pairs of bit lines BLP respectively. Further, binary high- and low-voltage states (for example, a power supply voltage Vcc and a ground voltage GND) of signals, signal lines and data are also referred to as high and low levels respectively. It is assumed that symbol "/" denotes inversion, negation, complementariness or the like.

Each of the MTJ memory cells MC and the dummy memory cells DMC has the tunnel magnetic resistance element TMR and the access transistor ATR serially connected between the corresponding bit line BL and the ground voltage GND. The gate of the access transistor ATR is connected with the corresponding read word line RWL. The source of the access transistor ATR is supplied with the ground voltage GND. The tunnel magnetic resistance element TMR is magnetized in a direction responsive to stored data, to have either electric resistance Rmax or Rmin.

While the electric resistance of each MTJ memory cell MC is expressed in the sum of the resistance of tunnel magnetic resistance element TMR and the ON-state value of the access transistor ATR and other parasitic resistance in a strict sense, the resistance components other than that of the tunnel magnetic resistance element TMR remain constant regardless of the stored data and hence it is assumed that Rmax and Rmin also represent two types of electric resistance values of each normal memory cell MC and AR represents the difference therebetween as follows:

$\Delta R = Rmax - Rmin$

The peripheral structures of the memory array 10 and the dummy memory array 10# are now described.

In data writing, the row decoders 20 and 22 activate the digit line DL for the selected row to a high level while setting the digit lines DL corresponding to the non-selected rows low. Consequently, the digit line DL activated high on one end is supplied with a data write current in a prescribed direction by the ground voltage GND connected to the other end. It is assumed that the row decoders 20 and 22 include digit line drivers (also referred to as DL drivers: not shown).

The row decoders 21 and 23 activate the read word line RWL for the selected row to a high level and inactivate the read word lines RWL for the non-selected rows to a low level in data reading on the basis of the row address RA. It is assumed that the row decoders 21 and 23 include word line drivers (also referred to as RWL drivers: not shown). In data writing, the read word lines RWL are inactivated low.

Thus, the digit line drivers and the word line drivers are arranged on opposite areas through the memory array 10 and the dummy memory array 10#, so that a wiring pitch for the drivers can be sufficiently ensured for improving the yield.

The MRAM device 1 according to the first embodiment of the present invention is further provided with a plurality of pairs of data buses in a region adjacent to the memory array 10 and the dummy memory array 10#. For example, a structure capable of reading 2-bit data in parallel with each other is described with reference to the first embodiment. More specifically, the MRAM device 1 includes a pair of data buses LIOP1 provided in correspondence to the odd pairs of bit lines BLP and a pair of data buses LIOP2 provided in correspondence to the even pairs of bit lines BLP. The pairs of data buses LIOP1 and LIOP2 include complementary data buses LIO1 and /LIO1 and complementary data buses LIO2 and /LIO2 respectively.

The pairs of data buses LIOP and the pairs of bit lines BLP are arranged to intersect with each other. Thus, the layout of circuit zones connected to the pairs of bit lines BLP and the pairs of data buses LIOP can be simplified. The pairs of data buses LIOP and the pairs of bit lines BLP are desirably orthogonally arranged to each other.

The MRAM device 1 further comprises column selection gates CSG1 to CSG4 provided in correspondence to the memory cell columns, i.e., the bit lines BL1, /BL1, BL2 and /BL2 respectively. The column selection gates CSG1 to CSG4 are hereinafter also generically referred to as column selection gates CSG.

Each bit line BL is connected with a prescribed one of the pair of data buses LIOP1 and LIOP2 through the corresponding column selection gate CSG. For example, the bit line BL1 is connected to the data bus LIO1 through the column selection gate CSG1, and the bit line /BL1 is connected to the data bus /LIO1 through the column selection gate CSG2.

The MRAM device 1 further comprises a column selection line provided in correspondence to the plurality of bit lines BL. FIG. 1 shows a column selection line CSL1 provided in correspondence to the four column selection gates CSG1 to CSG4. This column selection line CSL1 is hereinafter also generically referred to as a column selection line CSL.

The MRAM device 1 further comprises an AND circuit AD provided in correspondence to the column selection line CSL for receiving a result of decoding of the column selection line CSL and an inverted level of a selection line WE activated in writing and outputting a result of an AND logical operation to the corresponding column selection gate CSL. FIG. 1 shows an AND circuit AD1 corresponding to the column selection line CSL1. The AND circuit AD1 is also referred to as the AND circuit AD. The AND circuit AD outputs a high level to the corresponding column selection gate CSG on the basis of the result (high level) of decoding of the corresponding column selection line CSL and a low level of the selection line WE. In other words, the AND circuit AD activates the column selection gate CSG in response to the low level of the selection line SE and activation of the corresponding column selection line CSL in data reading.

The column decoder 25 activates one of the column selection line CSL corresponding to a result of column selection to a selected state (high level) in response to a result of decoding of the column address CA, i.e., the result of column selection.

The MRAM device 1 according to the first embodiment of the present invention further comprises a plurality of write data lines arranged on regions adjacent to the memory array 10 and the dummy memory array 10# for transmitting write data, a plurality of bit line drivers supplying a data write current responsive to the write data to the bit lines BL and a plurality of address lines transmitting a selection signal selecting the plurality of bit line drivers.

More specifically, the MRAM device 1 comprises write data lines WD1 and /WD1 provided in correspondence to the odd pairs of bit lines BLP and write data lines WD2 and /WD2 provided in correspondence to even pairs of bit lines BLP. The write data lines WD1 and /WD1 and the write data lines WD2 and /WD2 are arranged on opposite regions through the memory array 10 and the dummy memory array 10#.

Bit line drivers BDVa1 to BDVa4 and BDVb1 to BDVb4 are provided in correspondence to both ends of the bit lines BL1, /BL1, BL2 and /BL2 respectively.

The MRAM device 1 is further provided with an address line RA1 transmitting selection signals for the bit line drivers corresponding to the odd pairs of bit lines BLP and an address line RA2 transmitting selection signals for the corresponding bit line drivers corresponding to the even pairs of bit lines. More specifically, the address line RA1 is provided in correspondence to the bit line drivers BDVa1, BDVa2, BDVb1 and BDVb2 corresponding to the odd pair of bit lines BLP1. The address line RA2 is provided in correspondence to the bit line drivers BDVa3, BDVa4, BDVb3 and BDVb4 corresponding to the even pair of bit lines BLP2. The address lines RA1 and RA2 transmit selection signals according to partial bits of the row address RA.

More specifically, the bit line drivers BDVa1 and BDVb1 corresponding to the odd bit line BL1 are selected when the address line RA1 is activated high in data writing. When the address line RA1 is low, the bit line drivers BDVa2 and BDVb2 corresponding to the odd complementary bit line /BL1 are selected. When the address line RA2 is activated high, the bit line drivers BDVa3 and BDVb3 corresponding to the even bit line BL2 are selected. When the address line RA2 is low, the bit line drivers BDVa4 and BDVb4 corresponding to the even complementary bit line /BL2 are selected.

Figure 4:
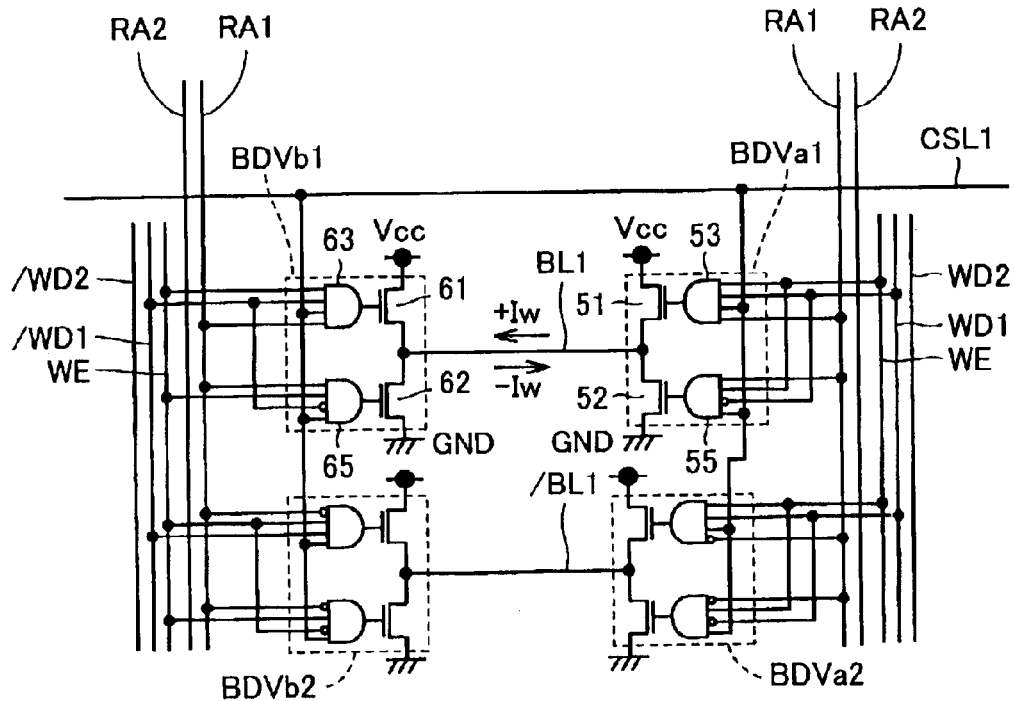
FIG. 4 is a circuit block diagram of bit line drivers.

Referring to FIG. 4 showing the circuit structure of the bit line drivers BDVa1 and BDVb1, the bit line driver BDVa1 has a bit line driver transistor 51 connected between the power supply voltage Vcc and an end (closer to the column decoder 25) of the bit line BL1, another bit line driver transistor 52 connected between the end of the bit line BL1 and the ground voltage GND and logic gates 53 and 55 for controlling the gate voltages of the bit line driver transistors 51 and 52 respectively.

The logic gate 53 outputs a result of an AND logical operation between four voltage levels of the write data line WD1, the selection line WE activated high in data writing, the address line RA1 and the column selection line CSL1 to the gate of the bit line driver transistor 51. The logic gate 55 outputs a result of an AND logical operation between four voltage levels of the inverted level of the write data line WD1, the selection line WE, the address line RA1 and the column selection line CSL1 to the gate of the bit line driver transistor 52.

The bit line driver BDVb1 has a bit line driver transistor 61 connected between the power supply voltage Vcc and the other end (opposite to the column decoder 25) of the bit line BL1, another bit line driver transistor 62 connected between this end of the bit line BL1 and the ground voltage GND and logic gates 63 and 65 for controlling the gate voltages of the bit line driver transistors 61 and 62 respectively.

The logic gate 63 outputs a result of an AND logical operation between four voltage levels of the write data line /WD1, the selection line WE, the address line RA1 and the column selection line CSL1 to the gate of the bit line driver transistor 61. The logic gate 65 outputs a result of an AND logical operation between four voltage levels of an inverted signal on the write data line /WD1, the selection line WE, the address line RA1 and the column selection line CSL1 to the gate of the bit line driver transistor 62.

The bit line drivers BDVa1 and BDVa3 are similar in structure to each other, and the bit line drivers BDVa2 and BDVa4 are also similar in structure to each other. The bit line drivers BDVa2 and BDVb2 are different from the bit line drivers BDVa1 and BDVa2 in the point that the same receive the inverted signal on the address line RA1 while the remaining structures of the former are similar to those of the latter. Therefore, redundant description is not repeated. The bit line drivers BDVa1 to BDVa4 and BDVb1 to BDVb4 are hereinafter also generically referred to as bit line drivers BDVa and BDVb.

The MRAM device 1 further comprises a data input circuit 80. The data input circuit 80, including an input buffer function, drives the voltages of the write data lines WD1, WD2, /WD1 and /WD2 in response to externally received input data DIN.

In order to write data with respect to the odd pair of bit lines BLP1 among the bit lines BL corresponding to the column selection line CSL, the data input circuit 80 drives the voltages of the write data lines WD1 and /WD1. In order to write data with respect to the even pair of bit lines BLP2 among the bit lines BL corresponding to the column selection line CSL, the data input circuit 80 drives the voltages of the write data lines WD2 and /WD2.

In order to write high-level data ("1") with respect to the bit line BL1 corresponding to the column selection line CSL1, for example, the data input circuit 80 drives the write data lines WD1 and /WD1 high (the power supply voltage Vcc) and low (the ground voltage GND) respectively. In order to write low-level data ("0") with respect to the bit line BL1 corresponding to the column selection line CSL1, the data input circuit 80 drives the write data lines WD1 and /WD 1 low and high respectively.

In order to write high-level data ("1") with respect to the bit line /BL1 corresponding to the column selection line CSL1, the data input circuit 80 drives the write data lines WD1 and /WD1 low and high respectively. In order to write low-level data ("0") with respect to the bit line /BL1 corresponding to the column selection line CSL1, the data input circuit 80 drives the write data lines WD1 and /WD1 high and low respectively.

In order to write high-level data ("1") with respect to the bit line BL2 corresponding to the column selection line CSL1, the data input circuit 80 drives the write data lines WD2 and /WD2 high (the power supply voltage Vcc) and low (the ground voltage GND) respectively. In order to write low-level data ("0") with respect to the bit line BL2 corresponding to the column selection line CSL1, the data input circuit 80 drives the write data lines WD2 and /WD2 low and high respectively.

In order to write high-level data ("1") with respect to the bit line /BL2 corresponding to the column selection line CSL1, the data input circuit 80 drives the write data lines WD2 and /WD2 low and high respectively. In order to write low-level data ("0") with respect to the bit line /BL2 corresponding to the column selection line CSL1, the data input circuit 80 drives the write data lines WD2 and /WD2 high and low respectively.

Thus, when high-level data is written with respect to the bit line BL1 (DIN="1"), for example, a data write current +Iw is fed to the bit line BL1 for the selected column from the bit line driver BDVa toward the bit line driver BDVb. When low-level data is written BL1 (DIN="0"), a data write current −Iw is fed to the bit line BL1 for the selected column oppositely to the above, i.e., from the bit line driver BDVb toward the bit line driver BDVa.

When high-level data is written with respect to the bit line /BL1 (DIN="1"), the data write current −Iw is fed to the bit line /BL1 for the selected column from the bit line driver BDVb toward the bit line driver BDVa. When low-level data is written (DIN="0"), the data write current −Iw is fed to the bit line /BL1 for the selected column oppositely to the above, i.e., from the bit line driver BDVa toward the bit line driver BDVb. If data write currents are fed to the complementary bit lines BL and IBL in the same direction for writing data of the same level, the level of data from a sense amplifier generated on the basis of a pair of complementary data buses is inverted when data is read from one of the bit lines BL and /BL. According to the aforementioned system, therefore, data write currents are supplied to the complementary bit lines BL and /BL in different directions for writing data of the same levels, so that the sense amplifier can output a proper data level with no correction.

A data write current flowing through each digit line DL generates a magnetic field along the hard axis of magnetization in each MTJ memory cell MC. A data write current flowing through each bit line BL in a direction responsive to write data generates a magnetic field along the easy axis of magnetization in each MTJ memory cell MC. Data responsive to the direction of the data write current flowing through the bit line BL is magnetically written in the memory cell MC connected with the digit line DL and the bit line BL fed with the data write currents.

The MRAM device 1 further comprises sense amplifiers SA provided in correspondence to the pairs of data buses LIOP and a data output circuit 75. FIG. 1 shows sense amplifiers SA1 and SA2 provided in correspondence to the pairs of data buses LIOP1 and LIOP2 respectively.

Figure 5:
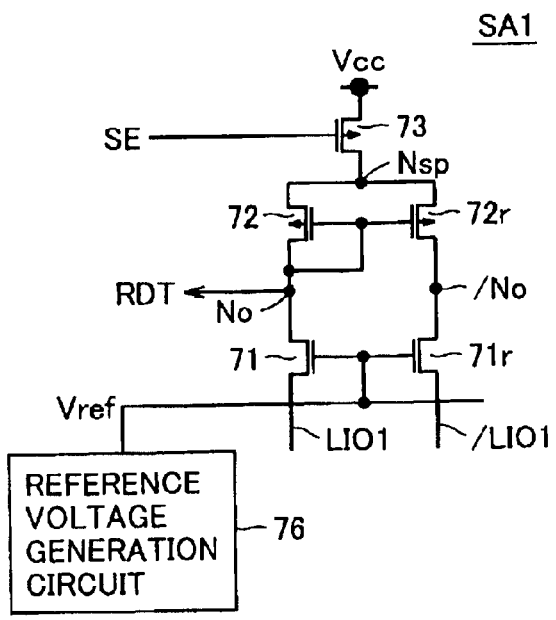
FIG. 5 is a circuit diagram showing the structure of a sense amplifier.

Referring to FIG. 5, the sense amplifier SA1 has an N-channel MOS transistor 71 connected between a node No and the data bus LIO1, another N-channel MOS transistor 71r connected between a node /No and the data bus /LIO1, a P-channel MOS transistor 72 connected between a node Nsp and the node No, another P-channel MOS transistor 72r connected between the nodes Nsp and /No and still another P-channel MOS transistor 73 connected between the power supply voltage Vcc and the node Nsp. The sense amplifier SA1 can alternatively have a power supply voltage independent of the power supply voltage Vcc.

The gates of the transistors 72 and 72r are connected to the node No. The transistors 72 and 72r form a current mirror circuit, for supplying the same current to the nodes No and /No.

The sense amplifier SA1 further has a reference voltage generation circuit 76 generating a constant reference voltage Vref.

The prescribed reference voltage Vref is input in the gates of the transistors 71 and 71r. The reference voltage Vref is set to about 400 mV, for example, in consideration of reliability of a tunnel film (insulator film) in the tunnel magnetic resistance element TMR. Thus, operational reliability can be improved by avoiding each memory cell MC from breakage resulting from application of an overvoltage.

The transistors 71 and 71r maintain the data buses LIO1 and /LIO1 at levels around the reference voltage Vref, while amplifying pass current difference between the data buses LIO1 and /LIO1 and converting the same to voltage difference AVL between the nodes No and /No. Consequently, the voltage difference AVL between the nodes No and /No has polarity responsive to the data stored in the selected memory cell MC. Thus, read data RDT can be generated on the basis of the voltages of the nodes No and /No.

A sense enable signal /SE activated low in data reading is input in the gate of the transistor 73. The transistor 73 supplies an operating current in response to activation (low level) of the sense enable signal /SE for operating the sense amplifier SA1.

In the data read operation, the read word line RWL for the selected row and the column selection line CSL corresponding to the selected column are activated. Thus, the corresponding column selection gate CSG is turned on. Consequently, a read current path is formed through the sense amplifier SA1, the selected data bus LIO1 or /LIO1, the column selection gate CSG, the selected bit line BL, the tunnel magnetic resistance element TMR, the access transistor ATR and the ground voltage GND, for feeding a read current Is responsive to the electric resistance, i.e., the data stored in the selected memory cell MC.

Further, the read word line RWLd1 or RWLd2 is activated in the dummy memory array 10# at similar timing. Consequently, a read current path is formed between the complementary data lines connected with the sense amplifier SA1, the complementary bit lines and the dummy memory cell DMC, for feeding a reference current Iref responsive to the electric resistance (intermediate resistance) of the dummy memory cell DMC.

According to this structure, the read current Is, corresponding to a memory cell current Icell passing through the selected memory cell MC, is so designed as to reach values Is(Rmax) and Is(Rmin) when the electric resistance of the selected memory cell MC is at the values Rmax and Rmin respectively. The aforementioned reference current Iref is designed to reach the intermediate value between the aforementioned values Is(Rmax) and Is(Rmin). The row decoder 21 activates the selected read word line RWL in response to entry of the row address RA. Thus, the access transistor ATR is turned on for electrically connecting the selected bit line BL1 or /BL1 and the selected memory cell MC with each other. The row decoder 23 activates either read word line RWLd1 or RWLd2 in the dummy memory array 10# in response to entry of the row address RA. Thus, the access transistor ATR is turned on for electrically connecting the bit line /BL1 or BL1 complementary to the selected bit line BL1 or /BL1 and the dummy memory cell DMC with each other. The row decoders 21 and 23, the read word lines RWL and the access transistors ATR form an address selection part connecting/controlling a memory cell MC of a prescribed address etc.

The data output circuit 75, including an output buffer function, outputs the read data RDT formed by the sense amplifier SA as output data DOUT.

The data write operation in the aforementioned MRAM device 1 is described with reference to FIG. 6. The MRAM device 1 writes data "1" in the selected memory cell MC corresponding to the bit line BL1 and the digit line DL1 corresponding to the column selection line CSL1, for example.

Figure 6:
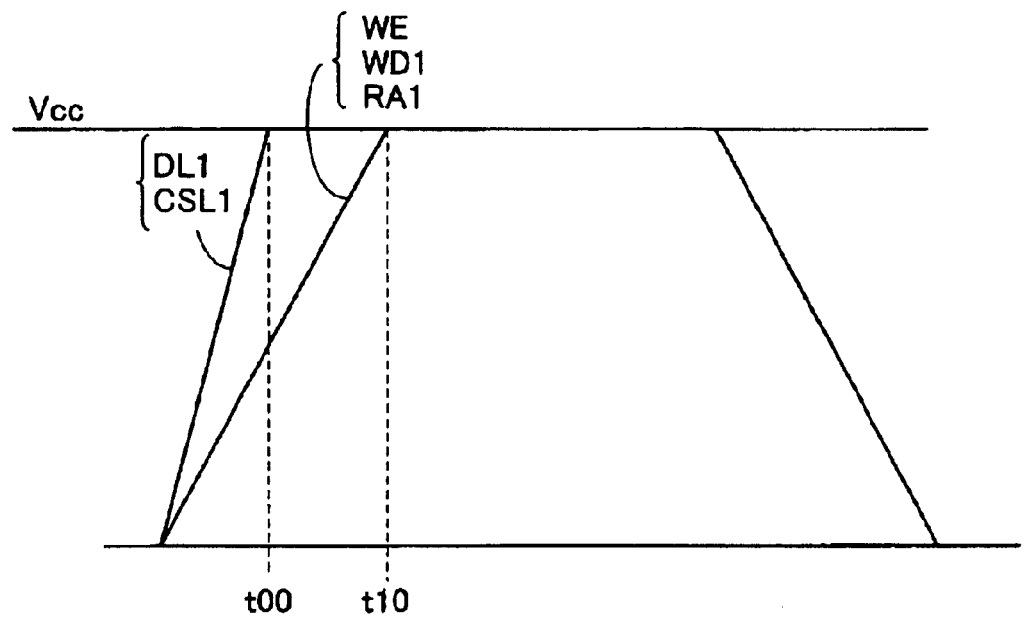
FIG. 6 is a timing chart illustrating a data write operation in the MRAM device.

Referring to FIG. 6, the digit line DL1 for the selected row and the column selection line CSL1 for the selected column are activated at a time t00 for data writing. The data input circuit 80 generates high-level write data. The selection line WE and the address line RA1 go high at similar timing (not shown).

At a time t10, the bit line drivers BDVa1 and BDVb1 are selected in response to the high-level address line RA1. The bit line drivers BDVa1 and BDVb1 supply the data write current +Iw in a direction responsive to the high-level write data to the bit line BL1 for the selected column in response to the high-level write data. A data write current Ip is supplied to the digit line DL1 for the selected row. Consequently, the data "1" is written in the selected memory cell MC located on the intersection between the digit line DL1 for the selected row and the bit line BL1 for the selected column.

According to the first embodiment of the present invention, the number of the bit line drivers connected to the write data lines can be reduced by associating each even pair of bit lines and each odd pair of bit lines with two write data lines respectively, for example. While only a selected bit line driver is driven in data writing, the remaining non-selected bit line drivers are also electrically connected with the write data lines. The aforementioned bit line drivers form logic circuits etc. with a plurality of transistor groups, and have parasitic capacitance to some extent also in a non-selected state. Thus, parasitic capacitance of the non-selected bit line drivers is applied to the write data lines. According to the structure of the first embodiment, the number of the non-selected bit line drivers connected to a single write data line is so reduced in data writing that the applied parasitic capacitance can be suppressed for propagating write data to the write data line at a high speed.

Referring to the waveforms shown in FIG. 6, the period (t00–t10) for propagating the write data can be reduced due to the structure of the first embodiment. Therefore, data writing can be executed at a high speed by reducing the propagation period for the write data or the like.

The data read operation of the MRAM device 1 according to the first embodiment is described with reference to FIG. 7. Data are read from two selected memory cells MC corresponding to the bit lines BLI and BL2 and the read word line RWL2 corresponding to the column selection line CSL1, i.e., 2-bit data are read in parallel, for example. First, only data reading with reference to the bit line BL1 is described. It is assumed that the selection line WE is set low in data reading.

Figure 7:
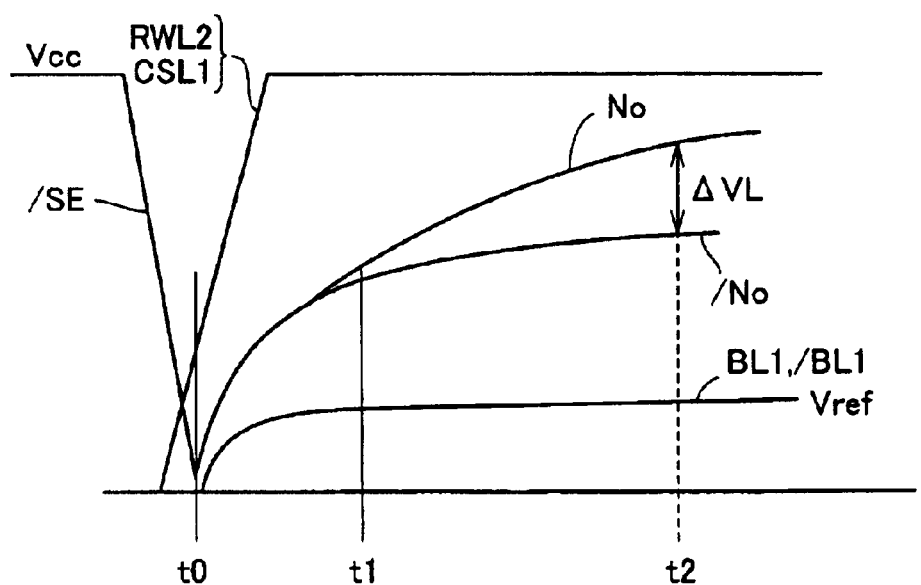
FIG. 7 is a timing chart illustrating a data read operation in the MRAM device.

Referring to FIG. 7, the read word line RWL2 corresponding to the selected row and the column selection line CSL1 for the selected column are activated substantially at a time t0 for activating the sense enable signal /SE. The bit line BL1 for the selected column is pulled down to the ground voltage GND through the selected memory cell MC. The bit line BL1 is further electrically coupled with the data bus LIO1 in response to activation of the column selection gate CSG1. The sense amplifier SA1 pulls up the data buses LIO1 and /LIO1 to the level of the reference voltage Vref in response to activation of the sense enable signal /SE, and maintains this voltage level.

At similar timing, the read word line RWLd1 corresponding to the dummy memory cell DMC corresponding to the bit line /BL1 complementary to the bit line BL1 for the selected column is activated (not shown). Thus, the complementary bit line /BL1 is pulled down to the ground voltage GND through the dummy memory cell DMC. The bit line /BL is further electrically coupled with the data bus /LIO1 in response to activation of the column selection gate CSG2.

Thus, the read current Is responsive to the data stored in the selected memory cell MC flows through the read current path including the bit line BL1 for the selected column. The reference current Iref responsive to the dummy memory cell DMC starts to flow through the bit line /BL1 and the data bus /LIO1.

The sense amplifier SA starts to amplify the voltage difference ΔVL based on the pass current difference at a time t1 when the bit lines BL1 and /BL1 and the data buses LIO1 and /LIO1 are charged to voltage levels allowing detection of the pass current difference.

At a time t2 when the voltage difference AVL sufficiently takes place, the sense amplifier SA1 outputs the read data RDT responsive to the data stored in the selected memory cell MC.

Data reading is executed also as to the bit line BL2 according to a system and timing similar to those for the bit line BL1. More specifically, the bit line BL2 is pulled down to the ground voltage GND through the selected memory cell MC in response to activation of the read word line RWL2. The bit line BL2 is further electrically coupled with the data bus LIO2 through the column selection gate CSG3. The complementary bit line /BL2 is electrically coupled with the dummy memory cell DMC connected to the ground voltage GND in response to activation of the read word line RWLd1. The bit line /BL2 is further electrically coupled with the data bus /LIO2 through the column selection gate CGS4. Thus, current paths are formed between the sense amplifier SA2 and the selected memory cell MC and the dummy memory cell DMC through the data buses LIO and the bit lines BL, so that the sense amplifier SA2 outputs the read data RDT responsive to the data stored in the selected memory cell MC.

According to the structure of the first embodiment of the present invention, the number of the columns selection gates CSG connected to the data buses LIO can be reduced by associating each even pair of bit lines and each odd pair of bit lines with two pairs of data buses LIOP respectively, for example. While the bit line BL corresponding to the activated column selection line CSL and the data bus LIO are electrically coupled with each other to form a current path in data reading, the column selection gates CSG corresponding to the remaining non-selected column selection lines CSL are also electrically coupled with the data buses LIO. Therefore, parasitic capacitance of the non-selected column selection gates CSG is applied to the data buses LIO.

According to the structure of the first embodiment, the number of the non-selected column selection gates CSG connected to a single data bus LIO is so reduced in data reading that the parasitic capacitance applied to the data bus LIO can be suppressed for reducing the time for charging the data bus LIO to a prescribed level in data reading.

Referring to the waveforms shown in FIG. 7, the period (t0–t1) for charging the data bus LIO to the prescribed voltage level can be reduced. Thus, data reading can be executed at a high speed.

When the column selection line CSL is provided in correspondence to a plurality of pairs of bit lines BLP for reading a plurality of bits of data in parallel with each other as in the first embodiment, the data reading speed can be further increased.

According to the structure of the first embodiment, the number of the column selection lines CSL can be reduced, the wiring pitch for the column selection lines CSL can be sufficiently ensured, and the yield can be improved. Further, the parasitic capacitance of the column selection lines CSL can be reduced due to the sufficiently ensured wiring pitch.

According to the first embodiment, data reading is executed through the complementary pair of bit lines BLP and the complementary pair of data buses LIOP, whereby noise applied to the complementary bit lines BL and the complementary data buses LIO can be cancelled for executing precise data reading.

While two pairs of bit lines are employed as a single group for reading 2-bit data in parallel with two pairs of data buses in the aforementioned structure, the present invention is not restricted to this but a plurality of bits of data exceeding two bits can also be read by employing a plurality of pairs of bit lines as a single group and providing pairs of data buses in correspondence thereto.

While two pairs of bit lines are employed as a single group for independently writing data through two write data lines in this embodiment, the present invention is not restricted to this but a plurality of pairs of bit lines may alternatively be employed as a single group for providing write data lines responsive thereto and independently writing data.

While two pairs of bit lines BLP are employed as a single group for implementing data reading and data writing in this embodiment, the number of the bit lines BL forming each group may alternatively be varied with data reading and data writing. More specifically, four pairs of bit lines BLP may be employed as a single group in data reading for reading 4-bit data in parallel with each other while employing two pairs of bit lines BLP as a single group in data writing. When the number of the pairs of bit lines BLP forming each group is varied with data reading and data writing, efficient data reading can be implemented in consideration of power consumption by reading a plurality of bits of data as to data reading requiring small power consumption, for example.

According to the first embodiment, the sense amplifier SA reads the stored data through the dummy memory cell DMC comparative with the selected memory cell MC. Alternatively, a reference current generation circuit regularly generating the reference current Iref may be provided without employing dummy memory cells DMC for selectively supplying the reference current Iref to the data bus /LIO or LIO paired with the data bus LIO or /LIO connected to the selected memory cell MC thereby executing data reading similarly to the above.

Modification of First Embodiment

The first embodiment has been described with reference to the structure of the MRAM device 1 including the dummy memory array 10# having the dummy memory cells DMC arranged to share the memory cell columns of the memory array 10.

A modification of the first embodiment is now described with reference to the structure of an MRAM device 2 including a dummy memory array 10*a*# having dummy memory cells arranged to share memory cell rows of a memory array 10.

Figure 8:
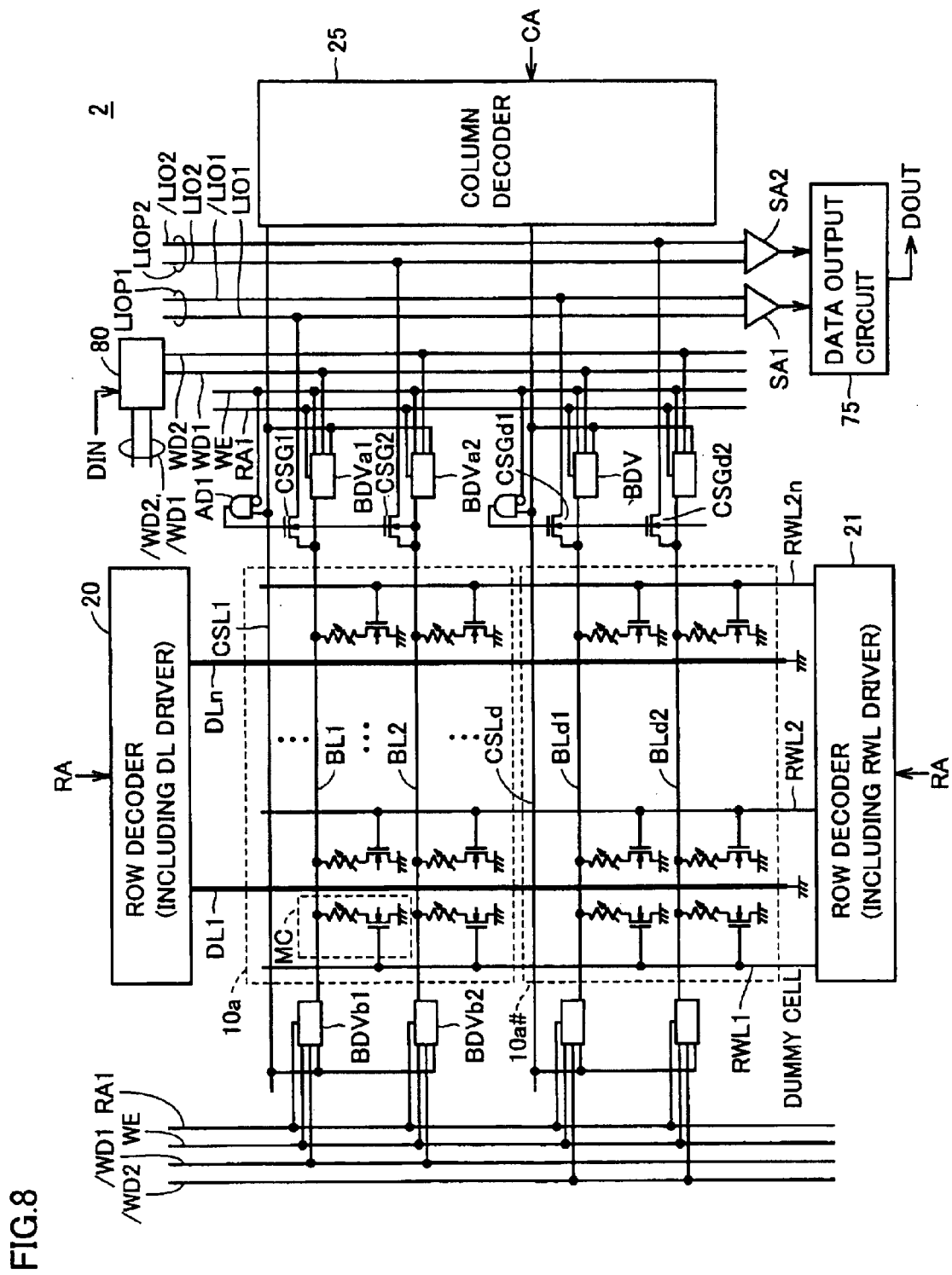
FIG. 8 is a circuit diagram showing the array structure of an MRAM device according to a modification of the first embodiment of the present invention.

Referring to FIG. 8, the MRAM device 2 according to the modification of the first embodiment of the present invention is different from the MRAM device 1 in a point that a memory array 10*a* substitutes for the memory array 10 with a dummy memory array 10*a*# having dummy cells arranged in rows and columns to share memory cell rows of the memory array 10*a*. Further, the MRAM device 2 has no row decoders 22 and 23 but row decoders 20 and 21 select rows of the memory array 10*a* and the dummy memory array 10*a*#.

The memory array 10*a* has memory cells MC arranged in rows and columns, while a plurality of bit lines BL are arranged in correspondence to the memory cell columns and a plurality of read word lines RWL are arranged in correspondence to the memory cell rows. A plurality of digit lines DL are provided in correspondence to adjacent pairs of memory cell rows to be shared by the adjacent pairs of memory cell rows. More specifically, FIG. 8 shows bit lines BL1 and BL2 provided in correspondence to the memory cell columns and read word lines RWL1 to RWL2*n* provided in correspondence to the memory cell rows. FIG. 8 also shows digit lines DL1 to DLn shared by adjacent pairs of memory cell rows.

The dummy memory array 10*a*# has a plurality of dummy memory cells sharing the memory cell rows. A plurality of dummy bit lines BLd are provided in correspondence to the dummy memory cell columns. FIG. 8 shows dummy bit lines BLd1 and BLd2 provided in correspondence to the dummy memory cell columns.

According to this structure, the dummy memory cells are arranged to share the memory cell rows, whereby word lines can be shared with the normal memory cells MC for allowing an efficient layout of the dummy memory cells.

The peripheral regions of the memory array 10*a* and the dummy memory array 10*a*# are now described.

The peripheral regions of the MRAM device 2 according to the modification of the first embodiment of the present invention are substantially similar to those of the MRAM device 1, except connectional relation between circuits.

More specifically, column selection lines CSL are provided in correspondence to adjacent two of bit lines in the structure of the modification of the first embodiment, for example. Referring to FIG. 8, a column selection line CSL1 is arranged in correspondence to the bit lines BL1 and BL2. In the dummy memory array 10*a*#, a column selection line CSLd is arranged in correspondence to the dummy bit lines BLd1 and BLd2.

Bit line drivers BDVa and BDVb are provided on both sides in correspondence to the memory cell columns. Referring to FIG. 8, bit line drivers BDVa1 and BDVb1 are provided in correspondence to the bit line BL1 of the memory array 10*a*, and bit line drivers BDVa2 and BDVb2 are provided in correspondence to the bit line BL2. The bit line drivers BDVa1, BDVa2, BDVb1 and BDVb2 are similar in structure to those illustrated with reference to FIG. 4, and hence redundant description is not repeated.

Column selection gates CSG are provided in correspondence to the memory cell columns, for electrically coupling the corresponding bit lines BL with corresponding data buses LIO. More specifically, a column selection gate CGS1 corresponding to the odd column is electrically coupled with a data bus LIO1 in data reading in response to activation of the column selection line CSL1. A column selection gate CGS2 corresponding to the even column is electrically coupled to a data bus LIO2 in data reading in response to activation of the column selection line CSL2.

Further, column selection gates CSGd1 and CSGd2 are provided in correspondence to the dummy bit lines BLd1 and BLd2 for the dummy memory cell columns respectively. The column selection gate CSGd1 electrically couples the dummy bit line BLd1 with a data bus /LIO1 in data reading in response to activation of the corresponding column selection line CSLd. The column selection gate CSGd2 electrically couples the dummy bit line BLd2 with a data bus /LIO2 in data reading in response to activation of the corresponding column selection line CSLd.

The MRAM device 2 has no address line RA2 but the bit line drivers corresponding to the same column selection lines CSL are electrically coupled to an address line RA1. Write data lines WD1 and /WD1 are arranged on both sides of the memory array 10*a* and the dummy memory array 10*a*# as transmission lines for data written with respect to the odd bit lines BL, and write data lines WD2 and /WD2 are arranged on both sides of the memory array 10*a* and the dummy memory array 10*a* as transmission lines for data written with respect to the even bit lines BL. Referring to FIG. 8, the bit line drivers BDVa1 and BDVb1 and the write data lines WD1 and /WD1 are electrically coupled with each other. The bit line drivers BDVa2 and BDVb2 and the write data lines WD2 and/WD2 are electrically coupled with each other.

A data input circuit 80, a data output circuit 75, a selection line WE, an AND circuit AD, sense amplifiers SA1 and SA2 and a column decoder 25 are similar in structure to those of the MRAM device 1, and hence redundant description is not repeated.

Data writing and data reading in the MRAM device 2 according to the modification of the first embodiment are now described.

First, data writing in the MRAM device 2 according to the modification of the first embodiment is described.

In order to write high-level data ("1") with respect to the selected bit line BL1 corresponding to the column selection line CSL1, for example, the data input circuit 80 drives the write data lines WD1 and /WD1 high (power supply voltage Vcc) and low (ground voltage GND) respectively. In order to write low-level data ("0") with respect to the selected bit line BL1 corresponding to the column selection line CSL1, the data input circuit 80 drives the write data lines WD1 and /WD 1 low and high respectively. Thus, a data write current +Iw is fed to the bit line BL1 for the selected column from the bit line driver BDVa toward the bit line driver BDVb when the high-level data is written with respect to the bit line BL1 (DIN="1"), for example. When the low-level data is written (DIN="0"), a data write current –Iw is fed in the opposite direction, i.e., from the bit line driver BDVb toward the bit line driver BDVa.

In order to write high-level data ("1") with respect to the bit line BL2 corresponding to the column selection line CSL1, the data input circuit 80 drives the write data lines WD2 and /WD2 high and low respectively. In order to write low-level data ("0"), the data input circuit 80 drives the write data lines WD2 and /WD2 low and high respectively.

Thus, the data write current +Iw is fed to the bit line BL2 for the selected column from the bit line driver BDVa toward the bit line driver BDVb when the high-level data is written with respect to the bit line BL2 (DIN="1"), for example. When the low-level data is written (DIN="0"), the data write current –Iw is fed to the bit line BL2 for the selected column in the opposite direction, i.e., from the bit line driver BDVb toward the bit line driver BDVa.

A data write current flowing through each digit line DL generates a magnetic field along the hard axis of magnetization in each MTJ memory cell MC. A data write current flowing through each bit line BL in a direction responsive to write data generates a magnetic field along the easy axis of magnetization in each MTJ memory cell MC. Data responsive to the direction of the data write current flowing through the bit line BL is magnetically written in the memory cell MC connected with the digit line DL and the bit line DL fed with the data write currents.

The data reading in the MRAM device 2 according to the modification of the first embodiment of the present invention is now described.

For example, 2-bit data are read from two selected memory cells MC corresponding to the bit lines BL1 and BL2 and the read word line RWL1 in parallel with each other. First, consider data reading with reference to only the bit line BL1.

In the memory array 10a, the read word line RWL1 for the selected row and the column selection line CSL1 corresponding to the selected column are activated. Thus, the corresponding column selection gate CSG1 is turned on. Consequently, a read current path is formed through the sense amplifier SA1, the selected data bus LIO1, the column selection gate CSG1, the selected bit line BL1, a tunnel magnetic resistance element TMR, an access transistor ATR and the ground voltage GND, for feeding a read current Is responsive to the electric resistance (i.e., stored data) of the selected memory cell MC.

Further, the column selection line CSLd is activated in the dummy memory array 10# at similar timing. Thus, the corresponding column selection gates CSGd1 and CSGd2 are turned on. Consequently, a read current path is formed through the sense amplifier SA1, the complementary selected data bus /LIO, the column selection gate CSGd1, the dummy bit line BLd1, a tunnel magnetic resistance element TMR of the dummy memory cell, an access transistor ATR and the ground voltage GND, for feeding a reference current Iref responsive to the electric resistance (i.e., an intermediate resistance value) of the dummy memory cell.

The sense amplifier SA1 converts the difference between the read current Is and the reference current Iref to voltage difference and outputs read data RDT responsive to the stored data. The row decoder 21 activates the selected read word line RWL in response to entry of a row address RA. Thus, the access transistor ATR is turned on for electrically connecting the selected bit line BL1 and the selected memory cell MC with each other. Further, the access transistor ATR of the dummy memory cell in the dummy memory array 10a# is turned on for electrically connecting the dummy bit line BLd1 and the dummy memory cell with each other. The row decoder 21, the read word lines RWL and the access transistors ATR form an address selection part executing connection control of memory cells MC of prescribed addresses etc.

Data reading is executed also as to the bit line BL2 according to a system and timing similar to those for the bit line BL1. More specifically, the bit line BL2 is pulled down to the ground voltage GND through the selected memory cell MC in response to activation of the read word line RWL1 for the selected row. The bit line BL2 is further electrically coupled with the data bus LIO2 through the column selection gate CSG2. Thus, the aforementioned read current path is formed between the sense amplifier SA2 and the selected memory cell MC.

In the dummy memory array 10a#, the dummy bit line BLd2 is electrically coupled with the dummy memory cell connected to the ground voltage GND and electrically coupled with the data bus /LIO2 through the column selection gate CSGd2 in response to activation of the read word line RWL1 for the selected row, for forming the aforementioned read current path.

Thus, the sense amplifier SA2 outputs read data RDT responsive to the data stored in the selected memory cell MC corresponding to the bit line BL2.

In data writing and data reading in the MRAM device 2 according to the modification of the first embodiment of the present invention, the column selection lines CSL, write data, a sense amplifier enable signal and the read word lines RWL are driven similarly to those shown in FIGS. 6 and 7, and hence redundant description is not repeated.

In the structure of the MRAM device 2 according to the modification of the first embodiment of the present invention, the number of bit line drivers connected to write data lines can be reduced by dividing a plurality of write data lines in correspondence to even and odd bit lines respectively, for example. As hereinabove described, parasitic capacitance applied to the write data lines can be suppressed, write data transmitted to the write data lines can be propagated at a high speed and the data can be written at a high speed by reducing the number of non-selected bit line drivers connected to each write data line in data writing.

In the structure of the MRAM device 2 according to the modification of the first embodiment of the present invention, further, the number of column selection gates connected to data buses can be reduced by dividing a plurality of data buses in correspondence to even and odd bit lines respectively, for example. As hereinabove described, applied parasitic capacitance can be suppressed, the time for charging the data buses to a prescribed level in data reading can be reduced and the data can be read at a high speed by reducing the number of non-selected column selection gates connected to each data bus in data reading.

In the structure of the MRAM device 2 according to the modification of the first embodiment of the present invention, in addition, an effect similar to that of the first embodiment of the present invention can be attained.

Referring to FIG. 8, the bit line drivers BDVa and BDVb are arranged also on both of the dummy bit lines BLd1 and BLd2 of the dummy memory array 10a# similarly to the memory array 10a in the structure of the MRAM device 2 according to the modification of the first embodiment of the present invention. While the dummy memory array 10a# has a layout pattern structure similar to that of the memory array 10a for improving the yield, the bit line drivers BDVa and BDVb may alternatively be omitted.

Second Embodiment

In the structure of the MRAM device 1 according to the aforementioned first embodiment, the data write current is fed to the bit line /BL oppositely to that fed to the bit line BL for executing data reading at the same data level so that data read through the bit line /BL is not inverted to that read through the bit line BL on the sense amplifier SA. The data input circuit 80 executes this control by inverting write data transmitted to the write data line WD when writing data with respect to the complementary bit line /BL.

An MRAM device 1a according to a second embodiment of the present invention is described with reference to a case of writing data with respect to a complementary bit line /BL without inverting write data in a data input circuit 80#.

Figure 9:
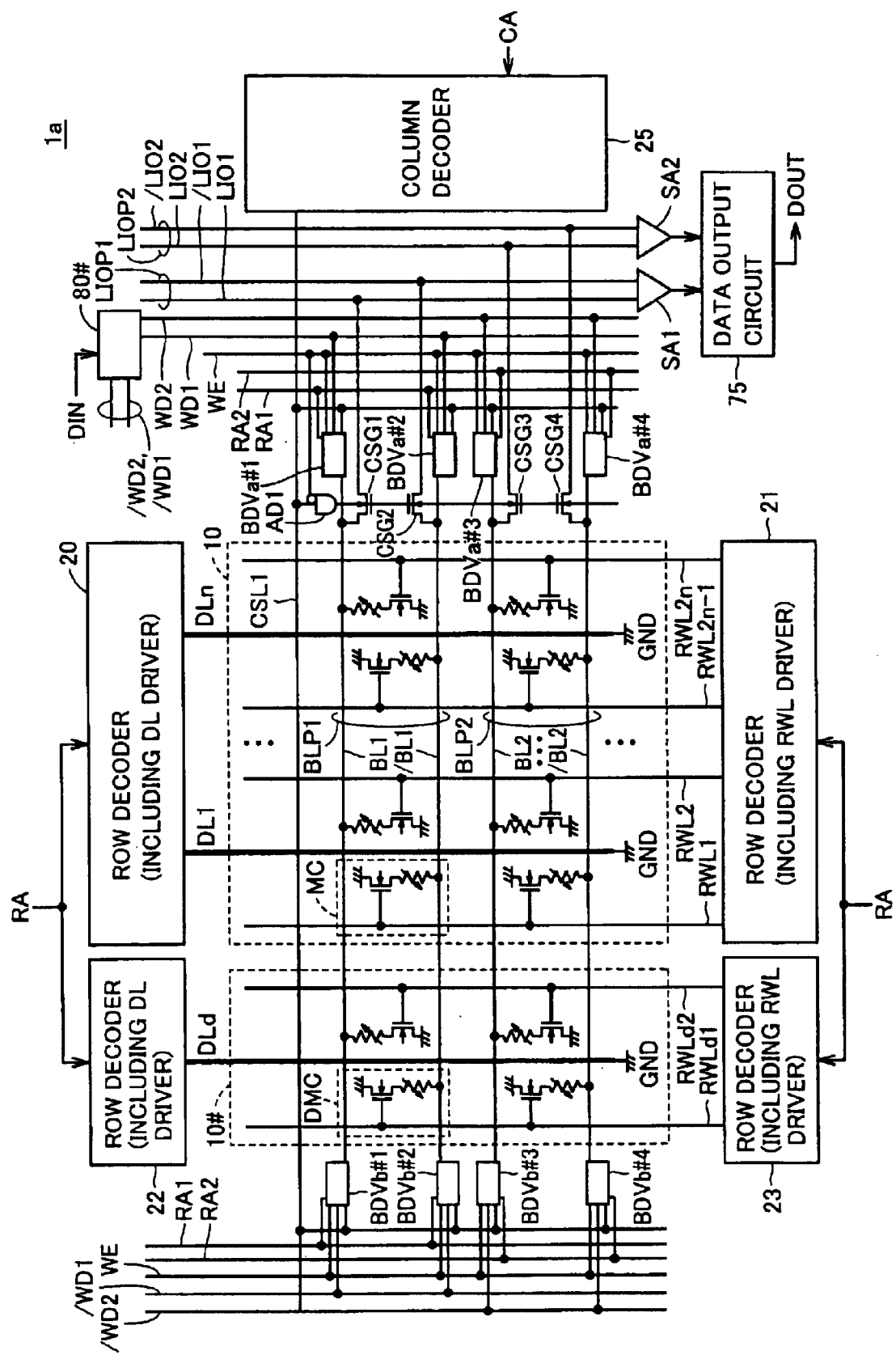
FIG. 9 is a circuit diagram showing the array structure of an MRAM device according to a second embodiment of the present invention.

Referring to FIG. 9, the MRAM device 1a according to the second embodiment of the present invention is different from the MRAM device 1 according to the first embodiment in a point that bit line drivers BDVa#1, BDVa#2, BDVb#1, BDVb#2. substitute for the bit line drivers BDVa1, BDVa2, BDVb1, BDVb2 . . . . The MRAM device 1a is different from the MRAM device 1 also in a point that the data input circuit 80# substitutes for the data input circuit 80. The remaining points of the MRAM device 1a are similar to those of the MRAM device 1, and hence redundant description is not repeated.

The bit line drivers BDVa#1 and BDVa#2 as well as the bit line drivers BDVb#1 and BDVb#2 are similar in structure to each other, and hence the structures of the bit line drivers BDVa# 1 and BDVb# 1 are now described.

Figure 10:
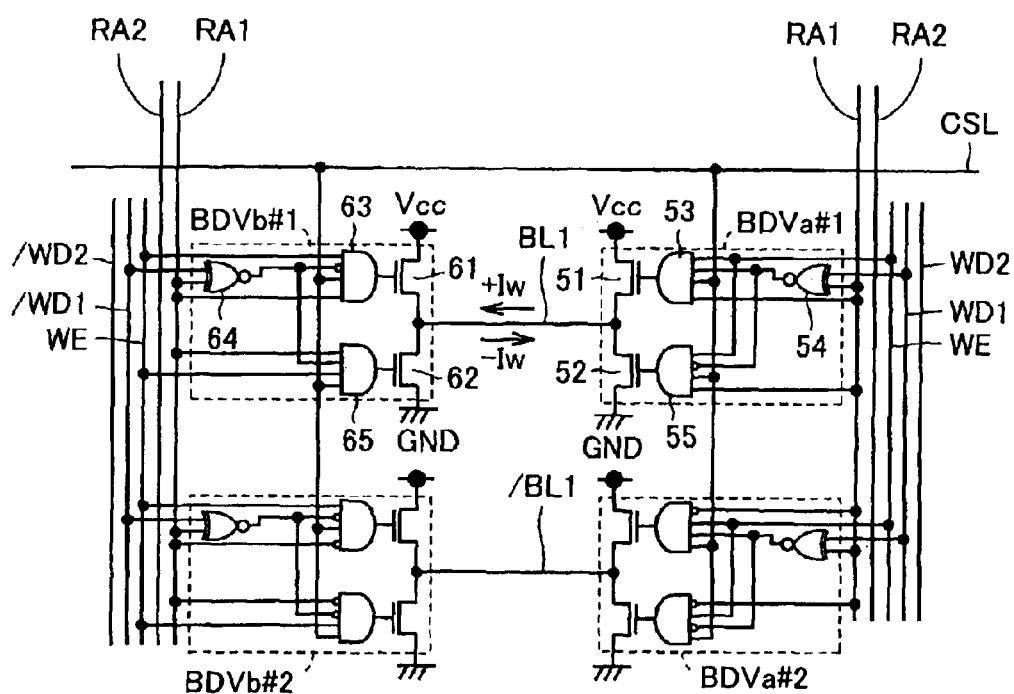
FIG. 10 is a circuit block diagram of bit line drivers according to the second embodiment of the present invention.

Referring to FIG. 10, the bit line driver BDVa#1 according to the second embodiment of the present invention is different from the bit line driver BDVa1 described with reference to FIG. 4 in a point that the same is further provided with an exclusive NOR circuit 54. The exclusive NOR circuit 54 receives the data from an address line RA1 and the write data from a write data line WD1 and outputs a result of an exclusive NOR logical operation to logic gates 53 and 55.

Similarly, the bit line driver BDVb#1 is different from the bit line driver BDVb1 described with reference to FIG. 4 in a point that the same is further provided with an exclusive NOR circuit 64. The exclusive NOR circuit 64 receives the data from the address line RA1 and the write data from a write data line /WD1 and outputs a result of an exclusive NOR logical operation to logic gates 63 and 65. Connectional relation between the remaining circuits in the bit line drivers BDVa#1, BDVb#1 are similar to that in the bit line drivers BDVa1, BDVb1, and hence redundant description is not repeated.

Operations of the data input circuit 80# and the bit line drivers etc. in data writing are now described in detail.

In order to write high-level data ("1") with respect to a selected bit line BL1 corresponding to a column selection line CSL1, for example, the data input circuit 80# drives the write data lines WD1 and /WD1 high (power supply voltage Vcc) and low (ground voltage GND) respectively. In the bit line driver BDVa#1, therefore, the exclusive NOR circuit 54 transmits the high-level write data to the logic gates 53 and 55 in response to the write data line WD1 and the address line RA1 (high). Thus, a bit line driver transistor 51 is turned on for electrically coupling the bit line BL1 with the power supply voltage Vcc.

In the bit line driver BDVb#1, on the other hand, the exclusive NOR circuit 64 transmits low-level write data to the logic gates 63 and 65 in response to the write data line /WD1 and the address line RA1 (low). Thus, a bit line driver transistor 62 is turned on to electrically couple the bit line BL1 with the ground voltage GND. Therefore, a data write current +Iw is supplied from the bit line driver BDV#a toward the bit line driver BDVb#.

In order to write low-level data ("0") with respect to the selected bit line BL1 corresponding to the column selection line CSL1, the data input circuit 80# drives the write data lines WD1 and /WD1 low and high respectively. In the bit line driver BDVa#1, therefore, the exclusive NOR circuit 54 transmits the low-level write data to the logic gates 53 and 55 in response to the write data line WD1 and the address line RA1 (low). Thus, a bit line driver transistor 52 is turned on to electrically couple the bit line BL1 with the ground voltage GND. In the bit line driver BDVb#1, on the other hand, the exclusive NOR circuit 64 transmits high-level write data to the logic gates 63 and 65 in response to the write data line /WD1 and the address line RA1 (low). Thus, the bit line driver transistor 61 is turned on to electrically couple the bit line BL1 to the power supply voltage Vcc. Therefore, a data write current −Iw is supplied from the bit line driver BDVb# toward the bit line driver BDVa#.

In order to write high-level data ("1") with respect to the bit line /BL1 corresponding to the column selection line CSL1, the data input circuit 80# drives the write data lines WD1 and /WD1 high and low respectively. In the bit line driver BDV#2, therefore, the exclusive NOR circuit 54 transmits the low-level write data to the logic gates 53 and 55 in response to the write data line WD1 and the address line RA1 (low). Thus, the bit line driver transistor 52 is turned on to electrically couple the bit line BL1 to the ground voltage GND.

In the bit line driver BDVb#1, on the other hand, the exclusive NOR circuit 64 transmits high-level write data to the logic gates 63 and 65 in response to the write data line /WD1 and the address line RA1 (low). Thus, the bit line driver transistor 61 is turned on to electrically couple the bit line /BL1 with the power supply voltage Vcc. Therefore, the data write current −Iw is supplied from the bit line driver BDVb# toward the bit line driver BDVa#.

In order to write low-level data ("0") with respect to the selected bit line /BL1 corresponding to the column selection line CSL1, the data input circuit 80# drives the write data lines WD1 and /WD1 high and low respectively. In the bit line driver BDVa#2, therefore, the exclusive NOR circuit 54 transmits high-level write data to the logic gates 53 and 55 in response to the write data line WD1 and the address line RA1 (high). Thus, the bit line driver transistor 51 is turned on to electrically couple the bit line /BL1 to the power supply voltage Vcc. In the bit line driver BDVb#1, on the other hand, the exclusive NOR circuit 64 transmits the low-level write data to the logic gates 63 and 65 in response to the write data line /WD1 and the address line RA1 (high). Thus, the bit line driver transistor 62 is turned on to electrically couple the bit line /BL1 to the ground voltage GND. Therefore, the data write current +Iw is supplied from the bit line driver BDVa# toward the bit line driver BDVb#.

According to the second embodiment of the present invention, the data input circuit 80# employing the bit line drivers BDVa# and BDVb# may not invert the voltage level of the data written with respect to the complementary bit line /BL from that in the bit line BL. In other words, the voltage levels of the write data are controlled in the bit line drivers BDVa# and BDVb#.

According to this structure, the data input circuit 80# may not perform specific control for inverting write data between the complementary bit lines BL and /BL in data writing, dissimilarly to the data input circuit 80 according to the first embodiment. Therefore, the MRAM device 1a can be readily designed.

Modification of Second Embodiment

The MRAM device 1a according to the aforementioned second embodiment controls the voltage levels of the write data in the bit line drivers BDVa# and BDVb# thereby implementing data writing in the complementary bit lines BL and /BL similarly to the first embodiment.

An MRAM device 1a# according to a modification of the second embodiment of the present invention is described with reference to a structure of correcting read data output from a bit line /BL without employing the bit line drivers BDVa# and BDVb# according to the aforementioned second embodiment and without inverting write data in a data input circuit 80.

Figure 11:
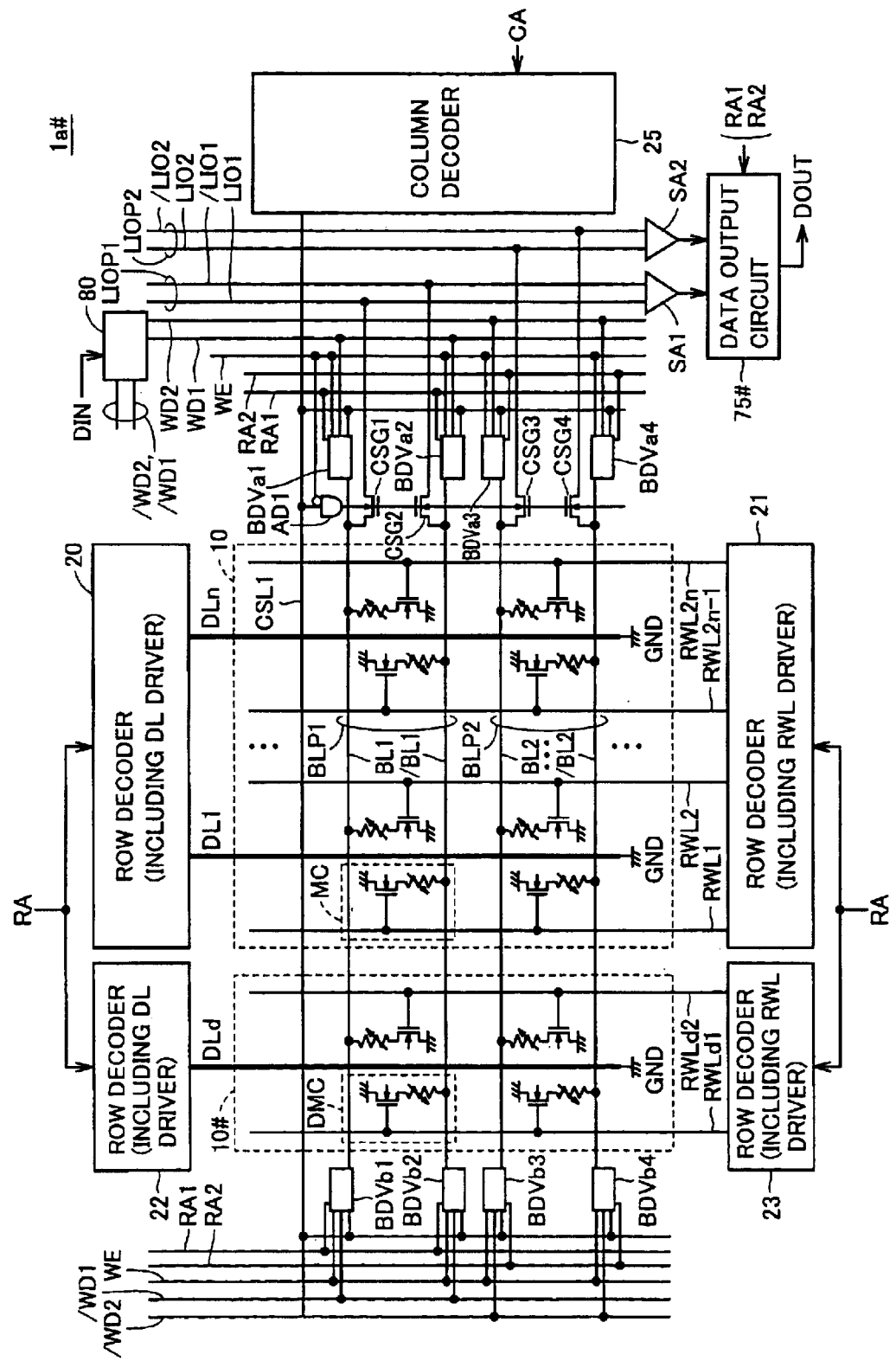
FIG. 11 is a circuit diagram showing the array structure of an MRAM device according to a modification of the second embodiment of the present invention.

Referring to FIG. 11, the MRAM device 1a# according to the modification of the second embodiment of the present invention is different from the MRAM device 1 according to the first embodiment in a point that the data input circuit 80 substitutes for the data input circuit 75. The remaining points of the MRAM device 1a# are similar to those of the MRAM device 1 according to the first embodiment, and hence redundant description is not repeated.

The data output circuit 75# receives signals transmitted from address lines RA1 and RA2, dissimilarly to the data output circuit 75.

Figure 12:
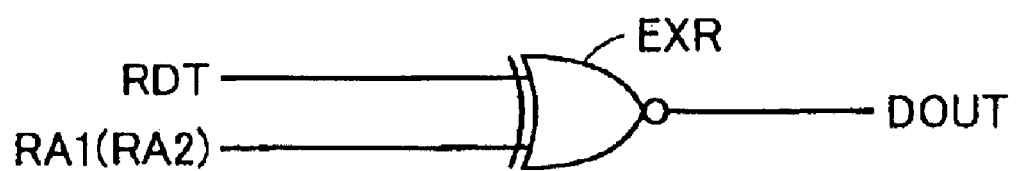
FIG. 12 illustrates an exclusive NOR circuit included in a data input circuit.

Referring to FIG. 12, the exclusive NOR circuit EXR receives read data RDT and a signal from the address line RA1 (RA2), and outputs a result of an exclusive NOR logical operation thereof as output data DOUT. More specifically, the exclusive NOR circuit EXR outputs the voltage level of the read data RDT as such when the address line RA1 (RA2) is high, while inverting the voltage level of the read data RDT and outputting the same when the address line RA1 (RA2) is low. In other words, the exclusive NOR circuit EXR outputs the output data DOUT in an inverted manner only when reading data from a complementary bit line /BL.

In the structure of the MRAM device 1a# according to the modification of the second embodiment, read data output from the complementary bit line /BL can be readily corrected. Thus, the number of circuit components can be reduced as compared with the second embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin-film magnetic memory device comprising:
    a plurality of memory cells arranged in rows and columns for magnetically storing data;
    a plurality of first bit lines, provided corresponding to memory cell columns respectively, divided into a plurality of groups each including at least X (X: integer of at least two) first bit lines;
    X write data lines transmitting write data; and
    a plurality of first write control circuits provided corresponding to said plurality of first bit lines respectively for supplying a data write current in accordance with said write data;
    a plurality of second bit lines, complementary to said plurality of first bit lines respectively, provided corresponding to said memory cell columns respectively, and
    a plurality of second write control circuits provided corresponding to said plurality of second bit lines respectively for supplying said data write current in accordance with said write data, wherein
        said X write data lines are electrically coupled with corresponding X first write control circuits in each of said groups, respectively,
        said X write data lines are further electrically coupled with corresponding X second write control circuits in each of said groups respectively, and
        each of said first and second write control circuits is selected in accordance with external addressing.

2. The thin-film magnetic memory device according to claim 1, wherein
    each of said first and second write control circuits includes a first current supply part supplying said data write current in a first direction in response to a first logic level of said write data, a second current supply part supplying said data write current in a second direction in response to a second logic level of said write data, and
    each of said second write control circuits receives an inverted logic level of said write data received from corresponding said write data line.

3. A thin-film magnetic memory device comprising:
    a plurality of memory cells arranged in rows and columns for magnetically storing data;
    a plurality of first bit lines, provided corresponding to memory cell columns respectively, divided into a plurality of first groups each including at least Y (Y: integer of at least two) first bit lines;
    at least one of Y read data lines supplied with a current in a state electrically connected with a selected memory cell among said plurality of memory cells selected as a subject for data read coupled with a first voltage in data reading;
    Y read circuits, provided corresponding to said Y read data lines respectively, each electrically coupling corresponding the read data line with a second voltage and generating read data on the basis of a current passing through said corresponding read data line in said data reading;
    a plurality of column selection lines provided corresponding to said plurality of first groups respectively; and
    a plurality of connection control parts, provided corresponding to said plurality of first groups respectively, each electrically coupling corresponding Y first bit lines and said Y read data lines respectively in corresponding the first group among said plurality of first groups in response to activation of corresponding the column selection line.

4. The thin-film magnetic memory device according to claim 3, wherein
    said plurality of first bit lines are divided into a plurality of second groups in data writing,
    each of said second groups includes X (X: integer of at least two) bit lines,
    said thin-film magnetic memory device further comprises:
        X write data lines transmitting write data, and
        a plurality of first write control circuits provided corresponding to said plurality of first bit lines respectively for supplying a data write current in accordance with said write data, and
    said X write data lines are electrically coupled with corresponding X first write control circuits respectively in each of said second groups.

5. The thin-film magnetic memory device according to claim 4, further comprising:
    a plurality of second bit lines, provided corresponding to said memory cell columns respectively, complementary to said plurality of first bit lines respectively, and
    a plurality of second write control circuits provided corresponding to said plurality of second bit lines respectively for supplying a data write current in accordance with said write data, wherein
        said X write data lines are further electrically coupled with corresponding X second write control circuits respectively in each of said second groups, and
        each of said first and second write control circuits includes a first current supply part supplying said data write current in a first direction in response to a first logic level of said write data, a second current supply data supplying said data write current in a second direction in response to a second logic level of said write data and a write data conversion circuit inverting the logic level of said write data received from corresponding the write data line in response to external addressing for outputting said write data to at least one of said first and second current supply parts.

6. The thin-film magnetic memory device according to claim 4, wherein said X and Y are different integers.

7. The thin-film magnetic memory device according to claim 3, wherein said plurality of first bit lines and said Y read data lines are arranged to intersect with each other.

8. The thin-film magnetic memory device according to claim 3, further comprising:

a plurality of dummy cells each generating a reference current forming the reference level for a current passing through said selected memory cell in said data reading, a plurality of second bit lines provided corresponding to said memory cell columns respectively, complementary to said plurality of first bit lines respectively, Y second read data lines, provided corresponding to said Y first read data lines respectively, each complementary to corresponding the first read data line, and Y connection control parts, provided corresponding to said plurality of first groups respectively, each electrically coupling corresponding Y second bit lines and said Y second read data lines each other in corresponding said first group among said plurality of first groups in response to activation of corresponding said column selection line, wherein said dummy cells are arranged along the row direction to share said memory cell columns with said plurality of memory cells, and said thin-film magnetic memory device further comprising an address selection part for connecting one and another of the first and second bit lines corresponding to a selected column with selected said memory cell and one of said plurality of dummy cells, respectively, in data reading.

9. The thin-film magnetic memory device according to claim 8, wherein each said read circuit includes a read data conversion circuit converting generated said read data in response to an external address.

10. The thin-film magnetic memory device according to claim 3, further comprising a plurality of dummy cells, each generating a reference current forming the reference level for a current passing through said selected memory cell, arranged along the column direction to share said memory cell rows with said plurality of memory cells, a plurality of word lines provided corresponding to said memory cell rows respectively, a dummy bit line provided corresponding to said plurality of dummy cells, Y second read data lines, provided corresponding to said V first read data lines respectively, each complementary to corresponding said first read data line so that each said connection control part electrically couples corresponding V said first bit lines and said Y read data lines with each other in corresponding said first group in response to activation of said corresponding column selection line, a dummy connection part controlling connection of said dummy bit line and each said second read data line in data reading, and an address selection part for connecting said first bit line corresponding to a selected column and a selected memory cell with each other and connecting said dummy bit line and one of said plurality of dummy cells with each other in response to activation of the word line corresponding to a selected row in said data reading.

11. A thin-film magnetic memory device comprising:

a plurality of memory cells arranged in rows and columns for magnetically storing data;

a plurality of first bit lines, provided corresponding to memory cell columns respectively;

a plurality of second bit lines, complementary to said plurality of first bit lines respectively, provided corresponding to said memory cell columns respectively;

a write data line transmitting write data;

a plurality of first write control circuits provided corresponding to said plurality of first bit lines respectively for supplying a data write current in accordance with said write data; and a plurality of second write control circuits provided corresponding to said plurality of second bit lines respectively for supplying said data write current in accordance with said write data, wherein said write data line is electrically coupled with said plurality of first and second write control circuits, and each of said first and second write control circuits is selected in accordance with external addressing.

12. A thin-film magnetic memory device comprising:

a plurality of memory cells arranged in rows and columns for magnetically storing data;

a plurality of bit lines, provided corresponding to memory cell columns respectively;

a read data line supplied with a current in a state electrically connected with a selected one of said plurality of memory cells that is coupled with a first voltage in data reading;

a read circuit electrically coupling said read data line with a second voltage and generating read data on the basis of a current passing through said read data line in said data reading;

a plurality of column selection lines provided corresponding to said plurality of bit lines; and a connection control part electrically coupling a corresponding bit line among said plurality of bit lines and said read data line in response to activation of a corresponding one of said plurality of column selection lines, wherein said read circuit includes a read data conversion circuit converting generated said read data in accordance with an external address.

* * * * *

UNITED STATES PATENT AND TRADEMARK OFFICE
CERTIFICATE OF CORRECTION

PATENT NO. : 6,791,876 B2
DATED : September 14, 2004
INVENTOR(S) : Hiroaki Tanizaki et al.

It is certified that error appears in the above-identified patent and that said Letters Patent is hereby corrected as shown below:

Title page,
Item [73], Assignees, change "Mitsubishi Electric Engineering and Company Limited" to -- Mitsubishi Electric Engineering Company Limited --.

Signed and Sealed this

Twenty-third Day of August, 2005

JON W. DUDAS
*Director of the United States Patent and Trademark Office*